United States Patent [19]

Nakamura et al.

[11] 4,178,604

[45] Dec. 11, 1979

[54] SEMICONDUCTOR LASER DEVICE

[75] Inventors: Michiharu Nakamura, Tokyo; Junichi Umeda, Hachioji, both of Japan

[73] Assignee: Hitachi, Ltd., Japan

[21] Appl. No.: 839,770

[22] Filed: Oct. 6, 1977

Related U.S. Application Data

[63] Continuation of Ser. No. 608,342, Aug. 27, 1975, abandoned, which is a continuation of Ser. No. 512,969, Oct. 7, 1974, abandoned.

[30] Foreign Application Priority Data

Oct. 5, 1973 [JP] Japan .................. 48-111454

[51] Int. Cl.² .................. H01S 3/19; H01L 29/205
[52] U.S. Cl. .................. 357/18; 357/16; 331/94.5 H
[58] Field of Search .......... 357/16, 18; 331/94.5 H

[56] References Cited

U.S. PATENT DOCUMENTS

| | | | |
|---|---|---|---|
| 3,691,476 | 9/1972 | Hayashi | 357/18 |
| 3,760,292 | 9/1973 | Kogelnick et al. | 357/18 |
| 3,868,589 | 2/1975 | Wang | 331/94.5 C |
| 3,911,376 | 10/1975 | Thompson | 357/18 |
| 4,023,993 | 5/1977 | Scifres et al. | 357/16 |
| 4,025,939 | 5/1977 | Aiki et al. | 357/18 |
| 4,045,749 | 8/1977 | Burnham et al. | 357/16 |

OTHER PUBLICATIONS

Nakamura et al. "Analysis of the Threshold of CH GaAs-GaAlAs Lasers with a Corrugated Interface" Optics Commun. vol. 11 (5/74) pp. 18–20.
Shank et al. "Double-Heterostructure GaAs Distributed-Feedback Laser" Applied Physics Letters vol. 25 (8/74) pp. 200–201.
Scifres et al. "Distributed-Feedback Single Heterojuncton GaAs Diode Laser" Applied Physics Letters vol. 25 (8/74) pp. 203–206.
Stoll et al. "Distributed Feedback GaAs Homojuncton Injecton Laser" Applied Optics vol. 13 (9/74) pp. 1981–1982.
Nakamura et al., "Liquid Phase Epitaxy of GaAlAs on GaAs Substrates with Fine Surface Corrugations", Applied Phy. Letters, vol. 24 (5/74), pp. 466–468.
Yang et al., "Epitaxial Growth Over Optical Gratings on GaAs", Applied Physics Letters, vol. 25 (7/74), pp. 67–68.
Kazarinov et al., "Injection Heterojunction Laser with a Diffraction Grating and Its Contact Surface", Sov. Phy.-Semiconductors, vol. 6 (1/73), pp. 1184–1189.
Panish et al., "Reduction of Threshold Current Density in GaAs-AlGaAs Heterostructure Lasers...", Applied Phy. Letters, vol. 22 (6/73), pp. 590–591.
Thompson et al., "Low Threshold-Current Density in 5-Layer Heterostructure (GaAl)As/GaAs ... Lasers", Electronics Letters, vol. 9 (6/73), pp. 295–296.
*Electronics,* (12/71), p. 62, "The Latest Word on Laser Diodes".
Nakamura et al., "Double-Heterostructure Distributed Feedback Diode Lasers", IEEE Int. Electron Devices Meeting Tech. Dig. (12/74), pp. 88–90.
Aiki, Nakamura et al., "GaAs-GaAlAs Distributed Feedback Diode Lasers ... ", Applied Physics Letters, vol. 27 (8/1/75), pp. 145–146.
Casey et al., "GaAs-Al$_x$Ga$_{1-x}$As Heterostructure Laser with Separate Optical and Carrier Confinement", J. Applied Physics, vol. 45 (1/74), pp. 322–333.

*Primary Examiner*—William D. Larkins
*Assistant Examiner*—Gene M. Munson
*Attorney, Agent, or Firm*—Craig and Antonelli

[57] ABSTRACT

A semiconductor laser device comprises an n-type GaAs layer, an n-type GaAlAs layer disposed on the n-type GaAs layer, a laser active layer consisting of a p-type GaAs layer disposed on the n-type GaAlAs layer, a first p-type GaAlAs layer disposed on the laser active layer, the surface of which opposing said laser active layer is a periodically corrugated surface, a second p-type GaAlAs layer disposed on the periodically corrugated surface of the first p-type GaAlAs layer, a p-type GaAs layer disposed on the second p-type GaAlAs layer, and electrodes disposed on the n-type and p-type GaAs layers, respectively, and having a very low threshold value for laser oscillation.

102 Claims, 4 Drawing Figures

SEMICONDUCTOR LASER DEVICE

CROSS REFERENCES TO RELATED APPLICATIONS

The present application is a Continuation of U.S. Patent application Ser. No. 608,342, filed Aug. 27, 1975, now abandoned, which in turn, is a Continuation application of Ser. No. 512,969, filed Oct. 7, 1974, now abandoned.

BACKGROUND OF THE INVENTION

1. Field of the Invention

The present invention relates to a semiconductor laser device and, more particularly, to a semiconductor laser device which does not have a resonator comprising parallel planes.

2. Brief Description of the Prior Art

As is well known in the art, conventional semiconductor laser devices consist of a laser medium which provides gain and a resonator structure which provides a feedback necessary for a build-up of laser oscillation. The resonator structure consists of at least two plane surfaces which are parallel to each other. These plane surfaces are usually formed by cleaving the laser medium, such as GaAs, GaP, etc.

This kind of semiconductor laser, however, has drawbacks such that integration with other semiconductor elements, such as transistors, diodes, etc. in one semiconductor body becomes very difficult, since the cleavage technique should be introduced to form the cavity resonator, and that a control of a wavelength generated therefrom becomes difficult, since the wavelength is determined by the length of the resonator which is defined by cleaved surfaces of the laser medium and it is very difficult to provide an accurate distance between cleaved surfaces.

In the field of semiconductor laser devices, it, therefore, has been desired to provide a semiconductor laser device which can be integrated with other semiconductor elements and the wavelength of which can be easily controlled.

There has been proposed a new type of a semiconductor laser device which is called a distributed feedback laser and which is capable to satisfy the above-mentioned needs ("Applied Physics Letters", Vol. 18, No. 4, Feb. 1971, pp. 152-154), and this semiconductor laser device has been developed and reported in "Applied Physics Letters", Vol. 22, No. 10, May 1973, pp. 515-516, and "Applied Physics Letters", Vol. 23, No. 5, September 1973, pp. 224-225.

The distributed feedback laser has a structure such that a surface of a laser active layer is periodically corrugated.

At the corrugated surface, however, there are many non-radiative recombination centers created during the fabrication of the corrugation at the surface of the laser active layer. Therefore, the distributed feedback laser has such a drawback that a threshold value for laser oscillation becomes high.

SUMMARY OF THE INVENTION

An object of the present invention, therefore, is to provide a distributed feedback laser whose threshold value is very low when compared with the above-mentioned conventional distributed feedback laser.

Another object of the present invention is to provide a distributed feedback laser which can be integrated with other monolithic circuit components, whose wavelength can be easily controlled and which has a lower threshold value than that in the conventional distributed feedback laser.

The objects mentioned above are accomplished by providing on a laser active layer, a first semiconductor layer consisting of a semiconductor material whose refractive index is lower than that of the material of the laser active layer and whose surface opposing the laser active layer is periodically corrugated, and a second semiconductor layer consisting of a semiconductor material whose refractive index is lower than that of the material of the first semiconductor layer on the periodically corrugated surface of the first semiconductor layer.

It is preferable in the present invention to make the thickness of the first semiconductor layer between 500 Å and 0.5 μm.

It is further preferable in the present invention to use a semiconductor material having a broader bad gap that that of the laser active layer as the semiconductor material of the first semiconductor layer.

Other objects, features and advantages of the present invention will be apparent from the following detailed description of some preferred embodiments thereof taken in conjunction with the accompanying drawings wherein like reference numerals are used to denote like parts.

DETAILED DESCRIPTION

Figure 1:
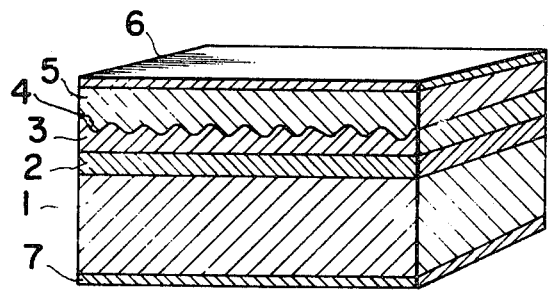
FIG. 1 is a schematic perspective view of one embodiment of the present invention.

Referring to FIG. 1 showing schematically one embodiment of the distributed feedback laser according to the present invention in perspective view, on a major surface of an n-type GaAs body 1 whose impurity concentration is about $1 \times 10^{18}$ cm$^{-3}$, a laser active layer 2 consisting of a p-type GaAs whose impurity concentration is about $5 \times 10^{17}$ cm$^{-3}$ is disposed on the body 1, a first semiconductor layer 3 consisting of p-type $Ga_{0.9}Al_{0.1}$. As whose surface 4 opposing the laser active layer 2 is a periodically corrugated surface disposed on the laser active layer 2, a second semiconductor layer 5 consisting of a p-type $Ga_{0.6}Al_{0.4}As$ is disposed on the periodically corrugated surface 4, and a metal layer 6 consisting of chromium and gold and a metal layer 7 consisting of gold containing germanium and nickel are disposed on the second semiconductor layer 5 and on the other surface opposing to the major surface of the GaAs body 1, respectively. The laser active layer 2 and the first semiconductor layer 3 form what is termed in the art as an "optical confinement region".

The thicknesses of the laser active layer 2, the first semiconductor layer 3 and the second semiconductor layer 5 are 0.1 μm, 0.3 μm and 2 μm, respectively. The period and the depth of the corrugations disposed on the surface 4 of the first semiconductor layer 3 are 0.123 μm and 500 Å, respectively. GaAs has an index of refraction $n_{GaAs}=3.6$; $Ga_{0.9}Al_{0.1}As$ has an index of refraction $n_{Ga_{0.9}Al_{0.1}As}=3.54$; and $Ga_{0.6}Al_{0.4}As$ has an index of refraction $n_{Ga_{0.6}Al_{0.4}As}=3.36$.

This distributed feedback laser emits a laser beam having a wavelength of 8750 Å when an electric current density more than 2000 A/cm$^2$ is applied to the laser active layer 2 through the electrodes 6 and 7. This threshold value of 2000 A/cm$^2$ is very low when compared with a distributed feedback laser wherein the corrugation is formed directly on one surface of the laser active layer, which has the same dimensions as the distributed feedback laser shown in FIG. 1, and whose threshold value is about 6000 A/cm$^2$, according to our experiments.

The distributed feedback laser having the above structure is fabricated in a manner as will be described below.

On a major surface of an n-type GaAs body having a thickness of about 400 μm, a p-type GaAs layer of 0.1 μm in thickness doped with Si, and a p-type $Ga_{0.9}Al_{0.1}As$ layer of 0.35 μm in thickness doped with Si are successively grown by a well known liquid phase epitaxial method. Then, a photoresist layer is formed on the surface of the p-type $Ga_{0.9}Al_{0.1}As$ layer, and a pair of ultra-violet light beams from a common source are directed onto the photoresist layer so that interference fringes are formed on the surface of said photo-resist layer. When the photo-resist layer is developed, a photo-resist having a periodically corrugated surface is obtained. After that, the resultant crystal is introduced into an ion milling machine and is etched by ions, thereby forming a resultant crystal having a periodically corrugated surface of the p-type $Ga_{0.9}Al_{0.1}As$ layer.

On the periodically corrugated surface, a p-type $Ga_{0.6}Al_{0.4}As$ layer of 2 μm in thickness doped with Si is grown by the well known liquid phase epitaxial method. Finally, chromium and gold are evaporated under vacuum on the surface of the p-type $Ga_{0.6}Al_{0.4}As$ layer, and gold containing germanium and nickel on the surface of the GaAs body for providing electrodes about 1 μm thick.

Figure 2:
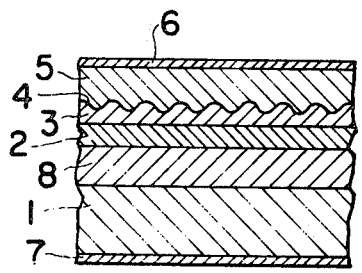
FIGS. 2 through 4 are schematic sectional views of other embodiments of the present invention.

Referring to FIG. 2 which is a schematic sectional view of another embodiment of the present invention, on an n-type GaAs body 1, a third semiconductor layer 8 consisting of an n-type $Ga_{0.7}Al_{0.3}As$ having a thickness of about 0.2 μm, a laser active layer 2 consisting of a p-type GaAs having a thickness of about 0.4 μm, a first semiconductor layer 3 about 0.2 μm thick, consisting of a p-type $Ga_{0.9}Al_{0.1}As$ whose surface opposing the laser active layer 2 is a periodically corrugated surface 4, and a second semiconductor layer 5 of a p-type $Ga_{0.6}Al_{0.4}As$ having a thickness of about 2 μm are successively disposed. In this embodiment, the optical confinement region is formed by the first semiconductor layer 3, the laser active semiconductor layer 2 and the third semiconductor layer 8.

In this distributed feedback laser device, the period and depth of the corrugations are 0.123 μm and 500 Å, respectively and, hence, the wavelength of a laser beam emitted therefrom is 8750 Å. The threshold current density of this laser device is 1,000 A/cm$^2$, which is very low when compared with a distributed feedback laser wherein a corrugation is disposed on the surface of the laser active layer, which has the same dimensions as in the distributed feedback laser of the present invention shown in FIG. 2, and which has a threshold current density of about 2,500 A/cm$^2$, according to our experiments. $Ga_{0.7}Al_{0.3}As$ has an index of refraction $n_{Ga_{0.7}Al_{0.3}As} = 3.4$.

Figure 3:
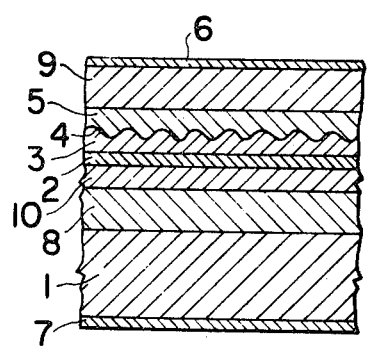

FIG. 3 is a schematic sectional view of still another embodiment of the present invention.

This distributed feedback laser device comprises an n-type GaAs body 1, a third semiconductor layer 8 consisting of an n-type $Ga_{0.6}Al_{0.4}As$ of 2 μm thick disposed on said body 1, a fourth semiconductor layer 10 consisting of an n-type $Ga_{0.9}Al_{0.1}As$ having a thickness of 0.2 μm disposed on the surface of the third semiconductor layer 8, a laser active layer 2 consisting of a p-type GaAs having a thickness of 0.07 μm disposed on the surface of the fourth semiconductor layer 10, a first semiconductor layer 3 consisting of a p-type $Ga_{0.9}Al_{0.1}As$ of 0.2 μm thick disposed on the laser active layer 2 and whose surface opposing the laser active layer 2 is a periodically corrugated surface, a second semiconductor layer 5 consisting of p-type $Ga_{0.5}Al_{0.5}As$ of 2 μm thick disposed on the corrugated surface, a fifth semiconductor layer 9 consisting of a p-type GaAs of 2 μm thick disposed on the second semiconductor layer, and electrodes 6 and 7 disposed on the fifth semiconductor layer 9 and on the body 1, respectively. In this embodiment, the optical confinement region is formed by the first semiconductor layer 3, the laser active semiconductor layer 2 and the fourth semiconductor layer 10.

In this distributed feedback laser device, the period and a depth of the corrugations are 0.123 μm and 500 Å, respectively. From this laser device, a laser beam having a wavelength of 8710 Å is emitted when a current density of at least 700 A/cm$^2$ is applied to the laser active layer 2 through the electrodes 6 and 7. This threshold value of 700 A/cm$^2$ is very low when compared with a distributed feedback laser wherein a corrugation is disposed on the surface of the laser active layer, which has the same dimensions as in the laser device of the present invention shown in FIG. 3, and whose threshold current density is about 2,000 A/cm$^2$ in our experiments.

This distributed feedback laser device is fabricated by the steps as follows.

An n-type $Ga_{0.6}Al_{0.4}As$ layer doped with Te, an n-type $Ga_{0.9}Al_{0.1}As$ layer doped with Te, a p-type GaAs layer doped with Si, and a p-type $Ga_{0.9}Al_{0.1}As$ layer doped with Si are formed successively on an n-type GaAs body by a conventional liquid phase epitaxy method. On the surface of the p-type $Ga_{0.9}Al_{0.1}As$ layer, a photoresist layer is formed, and ultra-violet laser light is directed onto said photoresist layer so that interference fringes are formed on the surface of said photoresist layer. When the photo-resist layer is developed, a photo-resist layer having a periodically corrugated surface is obtained. After that, the resultant crystal is introduced into an ion milling machine and is etched by ions, thereby forming a resultant crystal having a periodically corrugated surface on the p-type $Ga_{0.9}Al_{0.1}As$ layer. A p-type $Ga_{0.6}Al_{0.4}As$ layer doped with Si and a p-type GaAs layer doped with Zn are successively grown on the corrugated surface of the p-type $Ga_{0.9}Al_{0.1}As$ layer. Conductive layers of electrodes are formed on the p-type GaAs layer and on the GaAs body, respectively.

Figure 4:
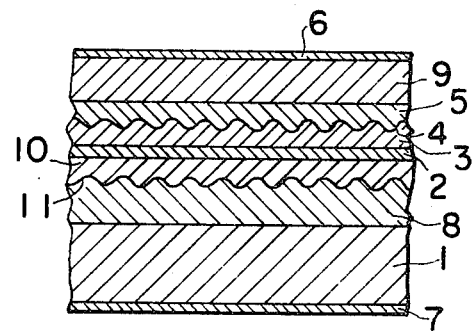

FIG. 4 is a schematic sectional view of a further embodiment of the present invention.

This distributed feedback laser device comprises an n-type GaAs body 1, a third semiconductor layer 8 consisting of an n-type $Ga_{0.6}Al_{0.4}As$ diposed on the body 1, a fourth semiconductor layer 10 consisting of an n-type $Ga_{0.9}Al_{0.1}As$ disposed on the third semiconductor layer 8, a laser active layer 2 consisting of an n-type GaAs disposed on the fourth semiconductor layer 10, a first semiconductor layer 3 consisting of a p-type $Ga_{0.-}$ 9Al0.1As disposed on the laser active layer 2, a second semiconductor layer 5 consisting of a p-type Ga0.6Al0.4As disposed on the said semiconductor layer 3, a fifth semiconductor layer 9 consisting of a p-type GaAs disposed on the second semiconductor layer 5, boundaries 4 and 11 between the first and second semiconductor layers and the third and fourth semiconductor layers are periodically corrugated, and electrodes 6 and 7 are disposed on the surfaces of the fifth semiconductor layer 9 and the GaAs body 1, respectively. In this embodiment; the optical confinement region is formed by the first semiconductor layer 3, the laser active semiconductor layer 2, and the fourth semiconductor layer 10.

The period and a depth of each of the corrugations 4 and 11 are 0.123 μm and 500 Å, and the phase of the corrugation 4 is in a reversed relation with that of the corrugation 11. The threshold current density of this distributed feedback laser device is 600 A/cm$^2$, and the wavelength of this laser device is 8710 Å.

In the above embodiment, although the phases of the corrugations are in a reversed relation with each other, corrugations having any phase relationship may be utilized.

While the invention has been explained in detail, it is to be understood that the technical scope of the invention is not limited to that of the foregoing embodiments.

For example, although the n-or p-type GaAs is utilized as the laser active layer, other materials capable of a lasing function may be utilized, examples of such materials are $Ga_{1-x}Al_xAs, Ga_{1-x}Al_xAs_{1-y}P_y, In_{1-x}Al_xAs$, and InGaP; $Ga_{1-x}Al_xAs$ (wherein x=0.1) is utilized for the first and fourth semiconductor layers but $Ga_{1-x}Al_xAs$ (wherein $0.1 \leq x \leq 0.2$) may be utilized; and also, although the GaAlAs layers are utilized for the first, second, third and fourth semiconductor layers, other materials having lower refractive indices than the refractive index of the material utilized for the laser active layer, such as $Ga_{1-x}Al_xAs_{1-y}P_y (0 \leq x, y \leq 1)$, $In_{1-x}Al_xAs (0 \leq x \leq 1)$, $In_{1-x}Ga_xP (0 \leq x \leq 1)$ may be utilized.

Further, in the above embodiments, although the thickness of the laser active layer is 0.1 μm, 0.4 μm or 0.07 μm, any thickness in the range from 0.01 to 5 μm may be utilized, and although the thickness of each of the first and third semiconductor layers is 0.3 μm, 0.2 μm or 0.1 μm, any thickness between 500 Å and 0.5 μm, preferably between 0.1 μm and 0.3 μm, more preferably between 0.2 μm and 0.25 μm may be employed.

Furthermore, the periods of the corrugations are not limited to the values in the embodiments. The periods are determined by the desired laser wavelength to be emitted from the laser device, since a laser wavelength λ of the laser device becomes $$\lambda = 2Sn/m,$$

wherein S is the period of the corrugation disposed on the surfaces of the first and third semiconductor layers, n is the effective refractive index of the laser active layer and m is an integer.

While various embodiments have been described by way of example, it is apparent to those skilled in the art that many changes and modifications may be made therein without departing from the spirit of the appended claims.

What we claim is:

1. A semiconductor laser device comprising:
   a semiconductor body of a first conductivity type having a major surface;
   a laser active semiconductor layer, disposed on said major surface of said body;
   a first semiconductor layer of a second conductivity type, opposite said first conductivity type, and having a thickness in the range from 500 Å to 0.5 μm and an index of refraction lower than that of said laser active layer, disposed on said laser active layer, the surface of said first semiconductor layer opposite that disposed on said laser active layer being corrugated; and
   a second semiconductor layer of said second conductivity type, disposed on the corrugated surface of said first semiconductor layer and having an index of refraction lower than that of said first semiconductor layer.

2. A semiconductor laser device according to claim 1, wherein the band gap of said first semiconductor layer is broader than that of said laser active layer.

3. A semiconductor laser device according to claim 2, wherein the band gap of said second semiconductor layer is broader than that of said first semiconductor layer.

4. A semiconductor laser device according to claim 1, wherein said laser active layer consists of GaAs and said first semiconductor layer consists of GaAlAs.

5. A semiconductor laser device according to claim 4, wherein said first semiconductor layer consists of $Ga_{1-x}Al_xAs$, wherein $0.1 \leq x \leq 0.2$.

6. A semiconductor laser device according to claim 1, further comprising first and second electrodes coupled to said second semiconductor layer and said body, respectively.

7. A semiconductor laser device comprising:
   a semiconductor body of a first conductivity type having a major surface;
   a laser active semiconductor layer, disposed on said major surface of said body;
   a first semiconductor layer of a second conductivity type, opposite said first conductivity type, and having a thickness in the range from 0.1 μm to 0.3 μm and an index of refraction lower than that of said laser active layer, disposed on said laser active layer, the surface of said first semiconductor layer opposite that disposed on said laser active layer being corrugated; and
   a second semiconductor layer of said second conductivity type, disposed on the corrugated surface of said first semiconductor layer and having an index of refraction lower than that of said first semiconductor layer.

8. A semiconductor laser device according to claim 7, wherein the band gap of said first semiconductor layer is broader than that of said laser active layer.

9. A semiconductor laser device according to claim 8, wherein the band gap of said second semiconductor layer is broader than that of said first semiconductor layer.

10. A semiconductor laser device according to claim 7, wherein said laser active layer consists of GaAs and said first semiconductor layer consists of GaAlAs.

11. A semiconductor laser device according to claim 10, wherein said first semiconductor layer consists of $Ga_{1-x}Al_xAs$, wherein $0.1 \leq x \leq 0.2$.

12. A semiconductor laser device according to claim 7, further comprising first and second electrodes coupled to said second semiconductor layer and said body, respectively.

13. A semiconductor laser device comprising:
a semiconductor body of a first conductivity type having a major surface;
a laser active semiconductor layer, disposed on said major surface of said body;
a first semiconductor layer of a second conductivity type, opposite said first conductivity type, and having a thickness in the range from 0.2 μm to 0.25 μm and an index of refraction lower than that of said laser active layer, disposed on said laser active layer, the surface of said first semiconductor layer opposite that disposed on said laser active layer being corrugated; and
a second semiconductor layer of said second conductivity type, disposed on the corrugated surface of said first semiconductor layer and having an index of refraction lower than that of said first semiconductor layer.

14. A semiconductor laser device according to claim 13, wherein the band gap of said first semiconductor layer is broader than that of said laser active layer.

15. A semiconductor laser device according to claim 14, wherein the band gap of said second semiconductor layer is broader than that of said first semiconductor layer.

16. A semiconductor laser device according to claim 13, wherein said laser active layer consists of GaAs and said first semiconductor layer consists of GaAlAs.

17. A semiconductor laser device according to claim 16, wherein said first semiconductor layer consists of $Ga_{1-x}Al_xAs$, wherein $0.1 \leq x \leq 0.2$.

18. A semiconductor laser device according to claim 13, further comprising first and second electrodes coupled to said second semiconductor layer and said body, respectively.

19. A semiconductor laser device comprising:
a semiconductor body of a first conductivity type having a major surface;
a first semiconductor layer of said first conductivity type, disposed on said major surface of said body;
a laser active semiconductor layer, having an index of refraction higher than that of said first semiconductor layer, disposed on said first semiconductor layer;
a second semiconductor layer of a second conductivity type, opposite said first conductivity type and having a thickness in the range from 500 Å to 0.5 μm and an index of refraction lower than that of said laser active layer, disposed on said laser active layer, the surface of said second semiconductor layer opposite that disposed on said laser active layer being corrugated; and
a third semiconductor layer of said second conductivity type, disposed on the corrugated surface of said second semiconductor layer and having an index of refraction lower than that of said second semiconductor layer.

20. A semiconductor laser device according to claim 19, wherein the band gap of said first semiconductor layer is broader than that of said laser active layer.

21. A semiconductor laser device according to claim 20, wherein said laser active layer consists of GaAs and said second semiconductor layer consists of GaAlAs.

22. A semiconductor laser device according to claim 21, wherein said second semiconductor layer consists of $Ga_{1-x}Al_xAs$, wherein $0.1 \leq x \leq 0.2$.

23. A semiconductor laser device comprising:
a semiconductor body of a first conductivity type having a major surface;
a first semiconductor layer of said first conductivity type, disposed on said major surface of said body;
a laser active semiconductor layer, having an index of refraction higher than that of said first semiconductor layer, disposed on said first semiconductor layer;
a second semiconductor layer of a second conductivity type, opposite said first conductivity type and having a thickness in the range from 0.1 μm to 0.3 μm and an index of refraction lower than that of said laser active layer, disposed on said laser active layer, the surface of said second semiconductor layer opposite that disposed on said laser active layer being corrugated; and
a third semiconductor layer of said second conductivity type, disposed on the corrugated surface of said second semiconductor layer and having an index of refraction lower than that of said second semiconductor layer.

24. A semiconductor laser device according to claim 23, wherein the band gap of said first semiconductor layer is broader than that of said laser active layer.

25. A semiconductor laser device according to claim 24, wherein said laser active layer consists of GaAs and said second semiconductor layer consists of GaAsAs.

26. A semiconductor laser device according to claim 25, wherein said second semiconductor layer consists of $Ga_{1-x}Al_xAs$, wherein $0.1 \leq x \leq 0.2$.

27. A semiconductor laser device comprising:
a semiconductor body of a first conductivity type having a major surface;
a first semiconductor layer of said first conductivity type, disposed on said major surface of said body;
a laser active semiconductor layer, having an index of refraction higher than that of said first semiconductor layer, disposed on said first semiconductor layer;
a second semiconductor layer of a second conductivity type, opposite said first conductivity type and having a thickness in the range from 0.2 μm to 0.25 μm and an index of refraction lower than that of said laser active layer, disposed on said laser active layer, the surface of said second semiconductor layer opposite that disposed on said laser active layer being corrugated; and
a third semiconductor layer of said second conductivity type, disposed on the corrugated surface of said second semiconductor layer and having an index of refraction lower than that of said second semiconductor layer.

28. A semiconductor laser device according to claim 27, wherein the band gap of said first semiconductor layer is broader than that of said laser active layer.

29. A semiconductor laser device according to claim 28, wherein said laser active layer consists of GaAs and said second semiconductor layer consists of GaAsAs.

30. A semiconductor laser device according to claim 29, wherein said second semiconductor layer consists of $Ga_{1-x}Al_xAs$, wherein $0.1 \leq x \leq 0.2$.

31. A semiconductor laser device comprising:
a semiconductor body of a first conductivity type having a major surface;
a first semiconductor layer of said first conductivity type disposed on said major surface of said body;

a second semiconductor layer of said first conductivity type, and having an index of refraction higher than that of said first semiconductor layer, disposed on said first semiconductor layer;

a laser active semiconductor layer, having an index of refraction higher than that of said second semiconductor layer, disposed on said second semiconductor layer;

a third semiconductor layer of a second conductivity type, opposite said first conductivity type, and having a thickness in the range from 500 Å to 0.5 μm and an index of refraction lower than that of said laser active layer disposed on said laser active layer, the surface of said third semiconductor layer opposite that disposed on said laser active layer being corrugated; and a fourth semiconductor layer of said second conductivity type, disposed on the corrugated surface of said third semiconductor layer and having an index of refraction lower than that of said third semiconductor layer.

32. A semiconductor laser device according to claim 31, further including a fifth semiconductor layer of said second conductivity type disposed on said fourth semiconductor layer.

33. A semiconductor laser device according to claim 32, wherein the band gap of said fourth semiconductor layer is broader than that of said third semiconductor layer.

34. A semiconductor laser device according to claim 33, wherein said laser active layer consists of GaAs and said third semiconductor layer consists of GaAsAs.

35. A semiconductor laser device according to claim 34, wherein said third semiconductor layer consists of $Ga_{1-x}Al_xAs$, wherein $0.1 \leq x \leq 0.2$.

36. A semiconductor laser device comprising:
a semiconductor body of a first conductivity type having a major surface;

a first semiconductor layer of said first conductivity type disposed on said major surface of said body;

a second semiconductor layer of said first conductivity type, and having an index of refraction higher than that of said first semiconductor layer, disposed on said first semiconductor layer;

a laser active semiconductor layer, having an index of refraction higher than that of said second semiconductor layer, disposed on said second semiconductor layer;

a third semiconductor layer of a second conductivity type, opposite said first conductivity type, and having a thickness in the range from 0.1 μm and 0.3 μm and an index of refraction lower than that of said laser active layer disposed on said laser active layer, the surface of said third semiconductor layer opposite that disposed on said laser active layer being corrugated; and a fourth semiconductor layer of said second conductivity type, disposed on the corrugated surface of said third semiconductor layer and having an index of refraction lower than that of said third semiconductor layer.

37. A semiconductor laser device according to claim 36, further including a fifth semiconductor layer of said second conductivity type disposed on said fourth semiconductor layer.

38. A semiconductor laser device according to claim 37, wherein the band gap of said fourth semiconductor layer is broader than that of said third semiconductor layer.

39. A semiconductor laser device according to claim 38, wherein said laser active layer consists of GaAs and said third semiconductor layer consists of GaAlAs.

40. A semiconductor laser device according to claim 39, wherein said third semiconductor layer consists of $Ga_{1-x}Al_xAs$, wherein $0.1 \leq x \leq 0.2$.

41. A semiconductor laser device comprising:
a semiconductor body of a first conductivity type having a major surface;

a first semiconductor layer of said first conductivity type disposed on said major surface of said body;

a second semiconductor layer of said first conductivity type, and having an index of refraction higher than that of said first semiconductor layer, disposed on said first semiconductor layer;

a laser active semiconductor layer, having an index of refraction higher than that of said second semiconductor layer, disposed on said second semiconductor layer;

a third semiconductor layer of a second conductivity type, opposite said first conductivity type, and having a thickness in the range from 0.2 μm to 0.25 μm and an index of refraction lower than that of said laser active layer disposed on said laser active layer, the surface of said third semiconductor layer opposite that disposed on said laser active layer being corrugated; and a fourth semiconductor layer of said second conductivity type, disposed on the corrugated surface of said third semiconductor layer and having an index of refraction lower than that of said third semiconductor layer.

42. A semiconductor laser device according to claim 41, further including a fifth semiconductor layer of said second conductivity type disposed on said fourth semiconductor layer.

43. A semiconductor laser device according to claim 42, wherein the band gap of said fourth semiconductor layer is broader than that of said third semiconductor layer.

44. A semiconductor laser device according to claim 43, wherein said laser active layer consists of GaAs and said third semiconductor layer consists of GaAlAs.

45. A semiconductor laser device according to claim 44, wherein said third semiconductor layer consists of $Ga_{1-x}Al_xAs$, wherein $0.1 \leq x \leq 0.2$.

46. A semiconductor laser device comprising:
a semiconductor body of a first conductivity type having a major surface;

a first semiconductor layer of said first conductivity type disposed on the surface of said body;

a second semiconductor layer of said first conductivity type and having a thickness in the range from 500 Å to 0.5 μm and an index of refraction higher than that of said first semiconductor layer, disposed on said first semiconductor layer, the surface of said second semiconductor layer disposed in contact with said first semiconductor layer being corrugated;

a laser active layer having an index of refraction higher than that of said second semiconductor layer, disposed on said second semiconductor layer;

a third semiconductor layer of a second conductivity type, opposite said first conductivity type and having a thickness in the range from 500 Å to 0.5 μm and an index of refraction lower than that of said laser active layer, disposed on said laser active layer, the surface of said third semiconductor layer opposite that disposed on said laser active layer being corrugated; and a fourth semiconductor layer of said second conductivity type and having an index of refraction lower than that of said third semiconductor layer disposed on the corrugated surface of said said third semiconductor layer.

47. A semiconductor laser device according to claim 46, further including a fifth semiconductor layer of said second conductivity type disposed on said fourth semiconductor layer.

48. A semiconductor laser device according to claim 47, wherein the band gap of said first semiconductor layer is broader than that of said fourth semiconductor layer.

49. A semiconductor laser device according to claim 48, wherein said laser active layer consists of GaAs and said second and third semiconductor layers consist of GaAlAs.

50. A semiconductor laser device according to claim 49, wherein said second and third semiconductor layers consist of $Ga_{1-x}Al_xAs$, wherein $0.1 \leq x \leq 0.2$.

51. A semiconductor laser device according to claim 47, wherein the corrugations are periodic and that between said first and second semiconductor layers is the same as that of the corrugation between said third and fourth semiconductor layers.

52. A semiconductor laser device according to claim 51, wherein the phase of the periodic corrugation between said first and second semiconductor layers is shifted by 180° relative to that of the periodic corrugation between said third and fourth semiconductor layers.

53. A semiconductor laser device according to claim 52, wherein said laser active layer consists of GaAs and said second and third semiconductor layers consist of GaAlAs.

54. A semiconductor laser device according to claim 53, wherein said second and third semiconductor layers consist of $Ga_{1-x}Al_xAs$, wherein $0.1 \leq x \leq 0.2$.

55. A semiconductor laser device comprising:
a semiconductor body of a first conductivity type having a major surface;
a first semiconductor layer of said first conductivity type disposed on the surface of said body;
a second semiconductor layer of said first conductivity type and having a thickness in the range from 0.1 μm to 0.3 μm and an index of refraction higher than that of said first semiconductor layer, disposed on said first semiconductor layer, the surface of said second semiconductor layer disposed in contact with said first semiconductor layer being corrugated;
a laser active layer having an index of refraction higher than that of said second semiconductor layer, disposed on said second semiconductor layer;
a third semiconductor layer of a second conductivity type, opposite said first conductivity type and having a thickness in the range of 0.1 μm to 0.3 μm and an index of refraction lower than that of said laser active layer, disposed on said laser active layer, the surface of said third semiconductor layer opposite that disposed on said laser active layer being corrugated; and a fourth semiconductor layer of said second conductivity type and having an index of refraction lower than that of said third semiconductor layer disposed on the corrugated surface of said third semiconductor layer.

56. A semiconductor laser device according to claim 55, further including a fifth semiconductor layer of said second conductivity type disposed on said fourth semiconductor layer.

57. A semiconductor laser device according to claim 56, wherein the band gap of said first semiconductor layer is broader than that of said fourth semiconductor layer.

58. A semiconductor laser device according to claim 57, wherein said laser active layer consists of GaAs and said second and third semiconductor layers consist of GaAlAs.

59. A semiconductor laser device according to claim 58, wherein said second and third semiconductor layers consist of $Ga_{1-x}Al_xAs$, wherein $0.1 \leq x \leq 0.2$.

60. A semiconductor laser device according to claim 56, wherein the corrugations are periodic and that between said first and second semiconductor layers is the same as that of the corrugation between said third and fourth semiconductor layers.

61. A semiconductor laser device according to claim 60, wherein the phase of the periodic corrugation between said first and second semiconductor layers is shifted by 180° relative to that of the periodic corrugation between said third and fourth semiconductor layers.

62. A semiconductor laser device according to claim 61, wherein said laser active layer consists of GaAs and said second and third semiconductor layers consist of GaAlAs.

63. A semiconductor laser device according to claim 62, wherein said second and third semiconductor layers consist of $Ga_{1-x}Al_xAs$, wherein $0.1 \leq x \leq 0.2$.

64. A semiconductor laser device comprising:
a semiconductor body of a first conductivity type having a major surface;
a first semiconductor layer of said first conductivity type disposed on the surface of said body;
a second semiconductor layer of said first conductivity type and having a thickness in the range from 0.2 μm to 0.25 μm and an index of refraction higher than that of said first semiconductor layer, disposed on said first semiconductor layer, the surface of said second semiconductor layer disposed in contact with said first semiconductor layer being corrugated;
a laser active layer having an index of refraction higher than that of said second semiconductor layer, disposed on said second semiconductor layer;
a third semiconductor layer of a second conductivity type, opposite said first conductivity type and having a thickness in the range from 0.2 μm to 0.25 μm and an index of refraction lower than that of said laser active layer, disposed on said laser active layer, the surface of said third semiconductor layer opposite that disposed on said laser active layer being corrugated; and
a fourth semiconductor layer of said second conductivity type and having an index of refraction lower than that of said third semiconductor layer disposed on the corrugated surface of said third semiconductor layer.

65. A semiconductor laser device according to claim 64, further including a fifth semiconductor layer of said second conductivity type disposed on said fourth semiconductor layer.

66. A semiconductor laser device according to claim 65, wherein the band gap of said first semiconductor layer is broader than that of said fourth semiconductor layer.

67. A semiconductor laser device according to claim 66, wherein said laser active layer consists of GaAs and said second and third semiconductor layers consist of GaAlAs.

68. A semiconductor laser device according to claim 67, wherein said second and third semiconductor layers consist of $Ga_{1-x}Al_xAs$, wherein $0.1 \leq x \leq 0.2$.

69. A semiconductor laser device according to claim 65, wherein the corrugations are periodic and that between said first and second semiconductor layers is the same as that of the corrugation between said third and fourth semiconductor layers.

70. A semiconductor laser device according to claim 69, wherein the phase of the periodic corrugation between said first and second semiconductor layers is shifted by 180° relative to that of the periodic corrugation between said third and fourth semiconductor layers.

71. A semiconductor laser device according to claim 70, wherein said laser active layer consists of GaAs and said second and third semiconductor layers consist of GaAlAs.

72. A semiconductor laser device according to claim 71, wherein said second and third semiconductor layers consist of $Ga_{1-x}Al_xAs$, wherein $0.1 \leq x \leq 0.2$.

73. A semiconductor laser device comprising:
a semiconductor body of a first conductivity type having a major surface, and
a plurality of contiguous semiconductor layers disposed on said major surface of said body, said plurality of contiguous semiconductor layers being comprised of:
(i) an optical confinement region having a pair of boundary surfaces and including
  (a) a laser active semiconductor layer,
  (b) a first semiconductor layer which has two opposite surfaces, a second conductivity type opposite said first conductivity type, and a band gap broader than that of said laser active layer, and
  (c) one of said boundary surfaces is one of said two opposite surfaces of said first semiconductor layer, spaced a distance 500Å-0.5 μm from said laser active semiconductor layer, and is corrugated; and
(ii) a second semiconductor layer of said second conductivity type, disposed on said one boundary surface of said optical confinement region, and having an index of refraction lower than that of said first semiconductor layer.

74. A semiconductor layer device according to claim 73, further comprising first and second electrodes coupled to said second semiconductor layer and said body, respectively.

75. A semiconductor laser device according to claim 73, wherein said plurality of contiguous semiconductor layers is further comprised of a third semiconductor layer of said second conductivity type, disposed on said second semiconductor layer.

76. A semiconductor laser device according to claim 75, further comprising first and second electrodes coupled to said third semiconductor layer and said body, respectively.

77. A semiconductor laser device according to claim 75, said third semiconductor layer consisting of GaAs.

78. A semiconductor laser device according to claim 73, said optical confinement region further having
(d) a fourth semiconductor layer, having two opposite surfaces, a band gap broader than that of said laser active layer, said first conductivity type, and being disposed on said laser active semiconductor layer.

79. A semiconductor laser device according to claim 78, wherein
one of said two opposite surfaces of said fourth semiconductor layer is a second boundary surface of said optical confinement region, and wherein
said plurality of contiguous semiconductor layers is further comprised of a fifth semiconductor layer of said first conductivity type, disposed on said fourth semiconductor layer, and having an index of refraction lower than that of said fourth semiconductor layer.

80. A semiconductor layer device according to claim 73, wherein said plurality of contiguous semiconductor layers consist of $Ga_{1-x}Al_xAs$ ($0 \leq x < 1$).

81. A semiconductor laser device according to claim 80, wherein said laser active semiconductor layer consists of GaAs.

82. A semiconductor laser device according to claim 80, wherein said first semiconductor layer consists of $Ga_{1-x}Al_xAs$ ($0.1 \leq x \leq 0.2$).

83. A semiconductor laser device comprising:
a semiconductor body of a first conductivity type having a major surface, and
a plurality of contiguous semiconductor layers disposed on said major surface of said body, said plurality of contiguous semiconductor layers being comprised of:
(i) an optical confinement region having a pair of boundary surfaces and including
  (a) a laser active semiconductor layer,
  (b) a first semiconductor layer which has two opposite surfaces, a second conductivity type opposite said first conductivity type, and a band gap broader than that of said laser active layer, and
  (c) one of said boundary surfaces is one of said two opposite surfaces of said first semiconductor layer, spaced a distance 0.1 μm-0.3 μm from said laser active semiconductor layer, and being corrugated; and
(ii) a second semiconductor layer of said second conductivity type, disposed on said boundary surface of said optical confinement region, and having an index of refraction lower than that of said first semiconductor layer.

84. A semiconductor layer device according to claim 83, further comprising first and second electrodes coupled to said second semiconductor layer and said body, respectively.

85. A semiconductor layer device according to claim 83, wherein said plurality of contiguous semiconductor layers is further comprised of a third semiconductor layer of said second conductivity type, disposed on said second semiconductor layer.

86. A semiconductor laser device according to claim 85, further comprising first and second electrodes coupled to said third semiconductor layer and said body, respectively.

87. A semiconductor laser device according to claim 85, said third semiconductor layer consisting of GaAs.

88. A semiconductor laser device according to claim 83, said optical confinement region further having
(d) a fourth semiconductor layer, having two opposite surfaces, a band gap broader than that of said laser active layer, said first conductivity type, and being disposed on said laser active semiconductor layer.

89. A semiconductor laser device according to claim 88, wherein
one of said two opposite surfaces of said fourth semiconductor layer is a second boundary surface of said optical confinement region, and wherein
said plurality of contiguous semiconductor layers is further comprised of a fifth semiconductor layer of said first conductivity type, disposed on said fourth semiconductor layer, and having an index of refraction lower than that of said fourth semiconductor layer.

90. A semiconductor laser device according to claim 83, wherein said plurality of contiguous semiconductor layers consist of $Ga_{1-x}Al_xAs$ ($0 \leq x < 1$).

91. A semiconductor laser device according to claim 90, wherein said laser active semiconductor layer consists of GaAs.

92. A semiconductor laser device according to claim 90, wherein said first semiconductor layer consists of $Ga_{1-x}Al_xAs$ ($0.1 \leq x \leq 0.2$).

93. A semiconductor laser device comprising:
a semiconductor body of a first conductivity type having a major surface; and
a plurality of contiguous semiconductor layers disposed on the major surface of said body, said plurality of contiguous semiconductor layers being comprised of:
a laser active semiconductor layer,
a first semiconductor layer having a band gap broader than that of said laser active semiconductor layer, and having a corrugated surface spaced a distance 500Å-0.5 μm from said laser active semiconductor layer, and
a second semiconductor layer disposed on said corrugated surface, and having a band gap broader than that of said laser active semiconductor layer.

94. A semiconductor laser device according to claim 93, further comprising first and second electrodes coupled to said second semiconductor layer and said body, respectively.

95. A semiconductor laser device according to claim 93, wherein said plurality of contiguous semiconductor layers consist of $Ga_{1-x}Al_xAs$ ($0 \leq x < 1$).

96. A semiconductor laser device according to claim 95, wherein said first semiconductor layer consists of $Ga_{1-x}Al_xAs$ ($0.1 \leq x \leq 0.2$).

97. A semiconductor laser device according to claim 93, wherein said first and second semiconductor layers have a second conductivity type, opposite said first conductivity type.

98. A semiconductor laser device comprising:
a semiconductor body of a first conductivity type having a major surface; and
a plurality of contiguous semiconductor layers disposed on the major surface of said body, said plurality of contiguous semiconductor layers being comprised of:
a laser active semiconductor layer,
a first semiconductor layer having a band gap broader than that of said laser active semiconductor layer, and having a corrugated surface spaced a distance 0.1 μm-0.3 μm from said laser active semiconductor layer, and
a second semiconductor layer disposed on said corrugated surface, and having a band gap broader than that of said laser active semiconductor layer.

99. A semiconductor laser device according to claim 98, further comprising first and second electrodes coupled to said second semiconductor layer and said body, respectively.

100. A semiconductor laser device according to claim 98, wherein said plurality of contiguous semiconductor layers consist of $Ga_{1-x}Al_xAs$ ($0 \leq x < 1$).

101. A semiconductor laser device according to claim 100, wherein said first semiconductor layer consists of $Ga_{1-x}Al_xAs$ ($0.1 \leq x \leq 0.2$).

102. A semiconductor laser device according to claim 98, wherein said first and second semiconductor layers have a second conductivity type, opposite said first conductivity type.

* * * * *